(12) United States Patent
You et al.

(10) Patent No.: US 11,552,134 B2
(45) Date of Patent: Jan. 10, 2023

(54) LIGHT EMITTING DIODE WITH MICROCAVITIES AND DIFFERENT REFLECTIVE LAYERS AND FABRICATING METHOD THEREOF, DISPLAY SUBSTRATE, AND DISPLAY APPARATUS

(71) Applicant: BOE Technology Group Co., Ltd., Beijing (CN)

(72) Inventors: Juanjuan You, Beijing (CN); Fang Liu, Beijing (CN); Linlin Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 450 days.

(21) Appl. No.: 16/484,631

(22) PCT Filed: Sep. 19, 2018

(86) PCT No.: PCT/CN2018/106477
§ 371 (c)(1),
(2) Date: Aug. 8, 2019

(87) PCT Pub. No.: WO2020/056623
PCT Pub. Date: Mar. 26, 2020

(65) Prior Publication Data
US 2021/0359036 A1    Nov. 18, 2021

(51) Int. Cl.
*H01L 27/32*    (2006.01)
*H01L 51/52*    (2006.01)
(Continued)

(52) U.S. Cl.
CPC ........ *H01L 27/3223* (2013.01); *H01L 27/322* (2013.01); *H01L 27/3211* (2013.01);
(Continued)

(58) Field of Classification Search
CPC ... H01L 51/5212–5218; H01L 51/5234; H01L 51/5271; H01L 27/3223; H01L 27/3211–3218
See application file for complete search history.

(56) References Cited

U.S. PATENT DOCUMENTS

2009/0230845 A1   9/2009   Kuma et al.
2020/0136095 A1*  4/2020   Ju ..................... H01L 51/5036

FOREIGN PATENT DOCUMENTS

CN    102956837 A    3/2013
CN    103441136 A    12/2013
(Continued)

OTHER PUBLICATIONS

International Search Report dated Jun. 24, 2019, issued in counterpart Application No. PCT/CN2018/106477 (9 pages).
(Continued)

*Primary Examiner* — Steven B Gauthier
*Assistant Examiner* — Candice Chan
(74) *Attorney, Agent, or Firm* — WHDA, LLP

(57) ABSTRACT

The present disclosure is related to a light emitting diode. The light emitting diode may include a pixel unit which may include a first sub-pixel. The first sub-pixel may include a dummy electrode layer and a first electrode layer on the dummy electrode layer. The dummy electrode layer may include a first reflective layer. The first electrode layer may include a second reflective layer and a second transparent conductive layer on the second reflective layer.

12 Claims, 12 Drawing Sheets

(51) Int. Cl.
H01L 51/56 (2006.01)
H01L 51/50 (2006.01)

(52) U.S. Cl.
CPC ...... H01L 27/3276 (2013.01); H01L 51/5271 (2013.01); H01L 51/56 (2013.01); H01L 51/5036 (2013.01); H01L 2227/323 (2013.01)

(56) References Cited

FOREIGN PATENT DOCUMENTS

| | | |
|---|---|---|
| CN | 106486512 A | 3/2017 |
| CN | 107154424 A | 9/2017 |
| CN | 107195584 A | 9/2017 |
| CN | 107994126 A | 5/2018 |
| CN | 109390372 A | 2/2019 |

OTHER PUBLICATIONS

Office Action dated Dec. 15, 2020, issued in counterpart CN Application No. 2018820001411.9, with English Translation. (25 pages).

* cited by examiner

Related Art

Related Art

Related Art

Related Art

Dep5

Dep6

Etch5

Etch6

Related Art

US 11,552,134 B2

LIGHT EMITTING DIODE WITH MICROCAVITIES AND DIFFERENT REFLECTIVE LAYERS AND FABRICATING METHOD THEREOF, DISPLAY SUBSTRATE, AND DISPLAY APPARATUS

TECHNICAL FIELD

The present invention relates to display technology, more particularly, to a light emitting diode and a fabricating method thereof, a display substrate, and a display apparatus.

BACKGROUND

As compared to other display apparatuses such as liquid crystal display (LCD) apparatuses, the organic light emitting diode (OLED) display apparatuses are self-emitting apparatuses that do not require a backlight. Having advantages such as fast response, wide viewing angle, high brightness, more vivid color rendering, thinner and lighter, the organic light emitting diode (OLED) display apparatuses have found a wide range of applications in display field.

BRIEF SUMMARY

The present disclosure is related to a light emitting diode. The light emitting diode utilizes a dummy layer in one or some of the sub-pixels to facilitate producing different lengths of microcavity, which may correspond to different colors of the sub-pixels. As a result, the manufacturing process of the light emitting diode is simplified and requires fewer steps. Furthermore, emitting efficiency of the light emitting diode is improved or maintained.

Accordingly, one example of the present disclosure is a light emitting diode. The light emitting diode may include a pixel unit. The pixel unit may include a first sub-pixel. The first sub-pixel may include a first electrode layer and a dummy electrode layer. The first electrode layer may be on the dummy electrode layer. The dummy electrode layer may include a first reflective layer, and the first electrode layer may include a second reflective layer and a second transparent conductive layer on the second reflective layer.

Another example of the present disclosure is a display substrate. The display substrate may include the light emitting diode according to one embodiment of the present disclosure.

Another example of the present disclosure is a display apparatus. The display apparatus may include the display substrate according to one embodiment of the present disclosure.

Another example of the present disclosure is a method of fabricating a light emitting diode. The method of fabricating the light emitting diode may include forming the first sub-pixel comprising a first electrode layer and a dummy electrode layer. The first electrode layer may be on the dummy electrode layer. The dummy electrode layer may include a first reflective layer, and the first electrode layer may include a second reflective layer and a second transparent conductive layer on the second reflective layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
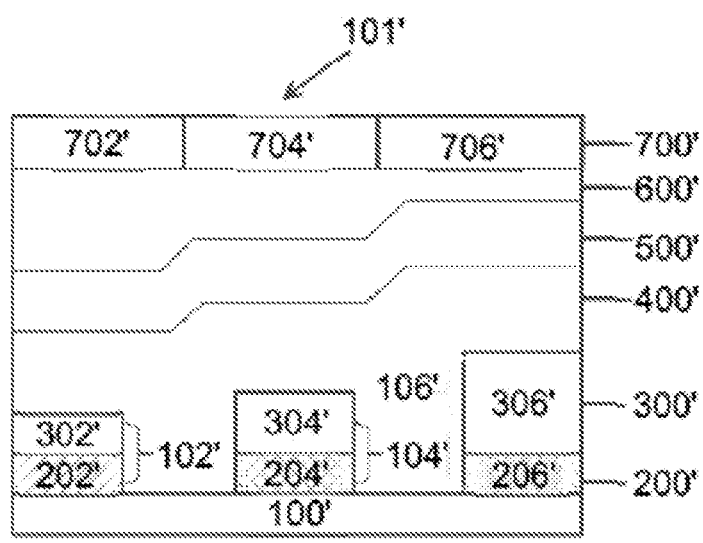
FIG. 1 is a diagram illustrating a structure of a first light emitting diode in the related art.

The present disclosure will be described in further detail with reference to the accompanying drawings and embodiments in order to provide a better understanding to those skilled in the art of the technical solutions of the present disclosure. Throughout the description of the disclosure, reference is made to FIGS. 1-9. When referring to the figures, like structures and elements shown throughout are indicated with like reference numerals.

FIG. 1 shows a top-emitting organic light emitting diode 101' in the related art. The top-emitting organic light emitting diode 101' includes a substrate 100', a reflective layer 200' on the substrate 100', an anode layer 300' on the reflective layer 200', a white Organic Light Emitting Diode (WOLED) emitting layer 400' on the anode layer 300', a cathode layer 500' on the white Organic Light Emitting Diode emitting layer 400', a planarization layer 600' on the cathode layer 500', and a color filter layer 700' on the planarization layer 600'. The organic light emitting diode 101' includes a pixel unit, which includes a first sub-pixel, a second sub-pixel and a third sub-pixel. The first sub-pixel includes a first electrode layer 102', which includes a first reflective layer 202' and a first transparent conductive layer 302'. The second sub-pixel includes a second electrode layer 104', which includes a second reflective layer 204' and a second transparent conductive layer 304'. The third sub-pixel includes a third electrode layer 106', which includes a third reflective layer 206' and a third transparent conductive layer 306'. The color filter layer 700' includes a first color filter 702', a second color filter 704' and a third color filter 706'. The anode layer 300' is used as an optical modulation layer and includes three transparent conductive layers having three different thicknesses in the first sub-pixel, the second sub-pixel and the third sub-pixel respectively. The presence of the optical modulation layer increases an optical distance between the WOLED emitting layer 400' and the reflective layer 200', thereby increasing a total cavity length of the WOLED and eliminating microcavity effect of the top-emitting WOLED.

Figure 2A:
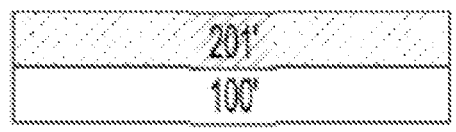
FIGS. 2A-2L are diagrams illustrating the fabrication process of the first light emitting diode in FIG. 1.
Figure 2B:
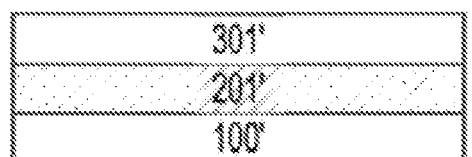
Figure 2C:
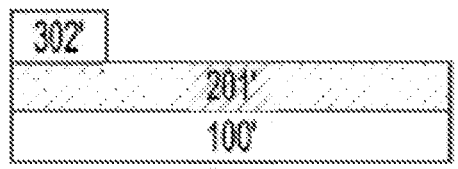
Figure 2D:
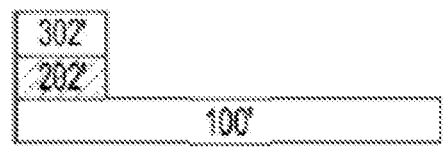
Figure 2E:
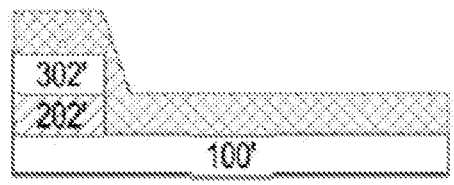
Figure 2F:
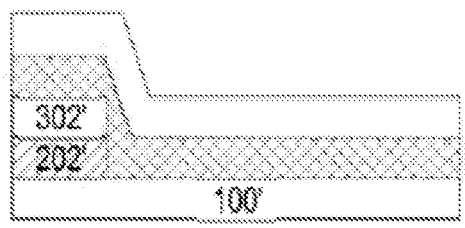
Figure 2G:
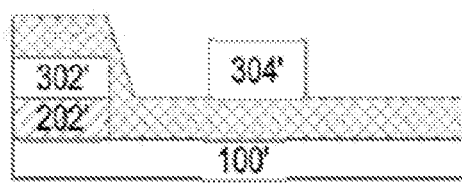
Figure 2H:
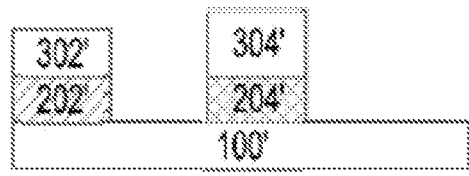
Figure 2I:
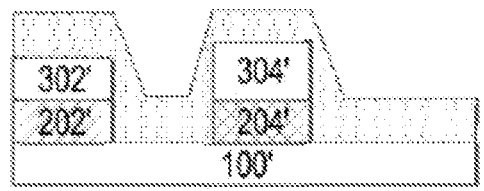
Figure 2J:
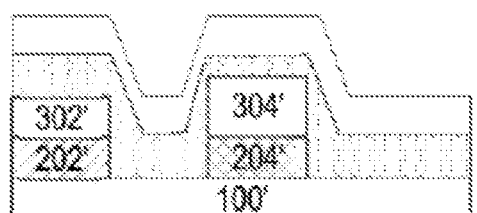
Figure 2K:
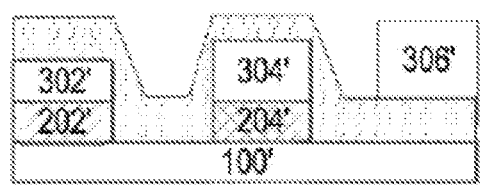
Figure 2L:
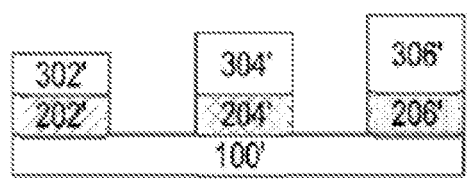

In the related art, a fabricating method of the top-emitting organic light emitting diode usually includes at least six deposition processes and six etching processes. For example, FIGS. 2A-2L show a fabricating method of the top-emitting organic light emitting 101' in FIG. 1 in the related art. As shown in FIGS. 2A and 2B, the method includes steps of sequentially depositing a reflective metal initial layer 201' (labeled as Dep1) and a transparent conductive initial layer 301'(labeled as Dep2) on the substrate 100', and then etching the transparent conductive initial layer 301' to form the first transparent conductive layer 302' (labeled as Etch1) as shown in FIG. 2C, and then etching the reflective metal initial layer 201' to form the first reflective layer 202'(labeled as Etch2) as shown in FIG. 2D. As shown in FIGS. 2E-2L, the above process is repeated twice to form the top-emitting organic light emitting diode 101'. The first repeated process includes steps of Dep3, Dep4, Etch 3 and Etch4, as shown in FIGS. 2E-2H respectively and the second repeated process includes steps of Dep5, Dep6, Etch 5 and Etch6, as shown in FIGS. 2I-2L respectively.

As shown in FIG. 1, the cathode layer 500' and the reflective layer 200' layer can form three different microcavities in three sub-pixels respectively because of the different thickness of the anode layer 300'. In the related art, manufacturing the above microcavities of three sub-pixels require a plurality of patterning processes, so that the manufacturing process is complicated and the yield is low. Accordingly, the manufacturing cost is high and the production efficiency is low.

Figure 3:
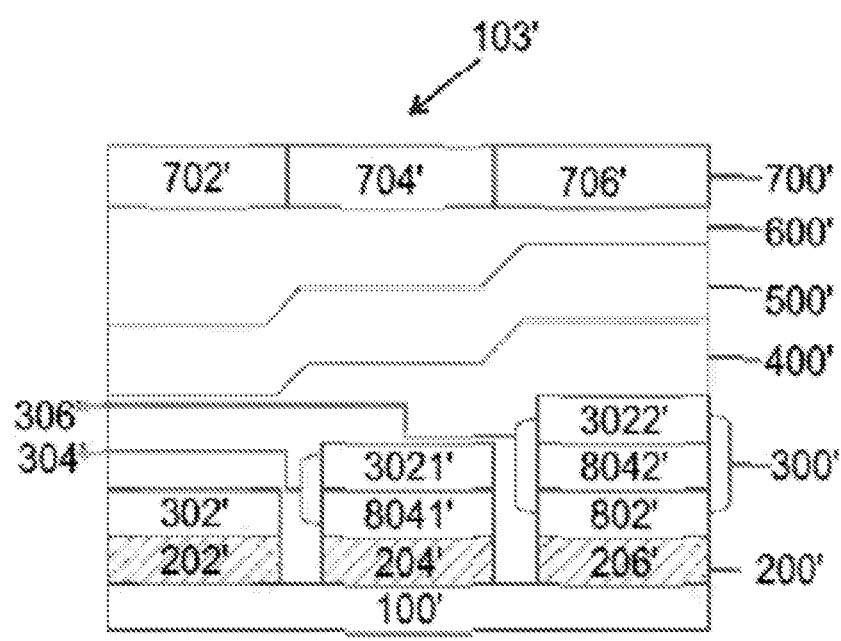
FIG. 3 is a diagram illustrating a structure of a second light emitting diode in the related art.

FIG. 3 shows a second top-emitting organic light emitting diode 103' in the related art. One difference between the second top-emitting organic light emitting diode 103' and the first top-emitting organic light emitting diode 101' is that the anode layer 300' used as an optical modulation layer in the organic light emitting diode 103' includes more than one sub-layers in some of the sub-pixels. That is to say, the anode layer 300' in some of the sub-pixels of the organic light emitting diode 103' is no longer a single layer. For example, the first transparent conductive layer 302' is a single layer. The second transparent conductive layer 304' includes two sub-layers: a second transparent conductive sub-layer 8041' and a third transparent conductive sub-layer 3021'. The third transparent conductive layer 306' includes three sub-layers: a fourth transparent conductive sub-layer 802', a fifth transparent conductive sub-layer 8042' and a sixth transparent conductive sub-layer 3022'. The layers identical to those in the first top-emitting organic light emitting diode 101' are not repeated here.

In the present disclosure, the order of the sub-pixels in the pixels is not limited. In some embodiments, the first sub-pixel, the second sub-pixel and the third sub-pixel are designated from left to right as an example. As used herein, the term "sub-pixel" refers to any portion of a pixel which can be independently addressable to emit a specific color. In some embodiments, a sub-pixel may include an emissive layer and a color filter. As used herein, the term "emissive layer" refers to a layer between two electrodes from which the light is generated and emitted. In some embodiments, the emissive layer includes a white Organic Light Emitting Diode emitting (WOLED) layer. The emissive layer may have a single-layer structure or a stacked-layer structure including two or more sub-layers (e.g., a stacked white OLED layer). As used herein, an emissive layer and a color filter may be considered as separate components of a sub-pixel. Therefore, the emissive layer may emit a light of a color, a color filter may convert (e.g., by filtering) the light emitted from the emissive layer into a different color. Alternatively, the light emitted from the emissive layer may be converted into a different color by a color filter including (e.g., doped with) quantum dots. Accordingly, light emitted from a sub-pixel may have a color different from that of the light emitted from an emissive layer within the sub-pixel.

Figure 4:
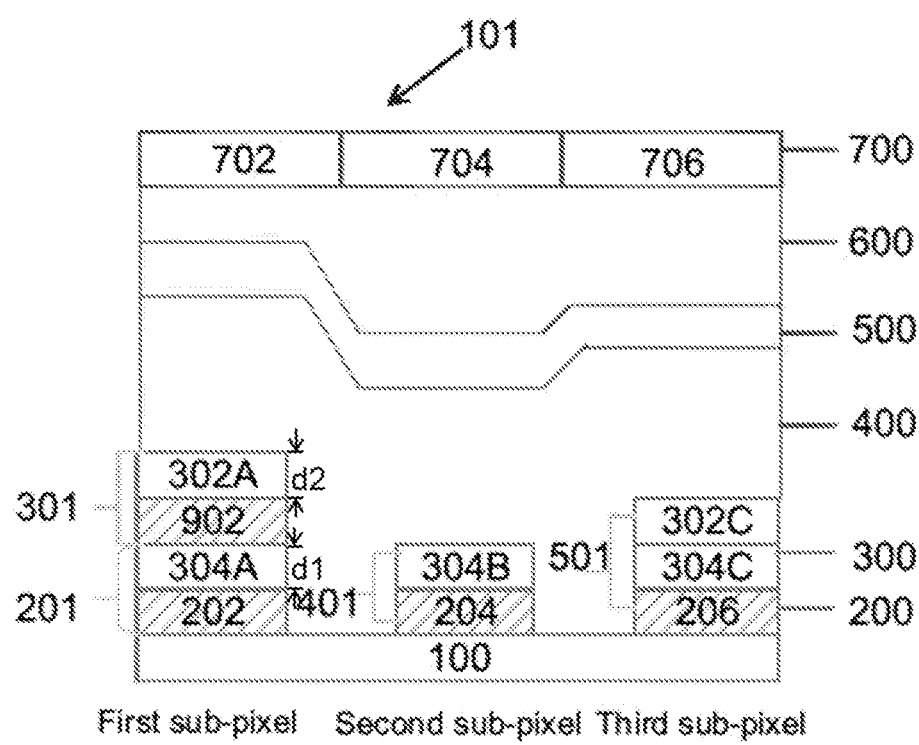
FIG. 4 is a diagram illustrating a structure of a light emitting diode according to some embodiments of the present disclosure.
Figure 5:
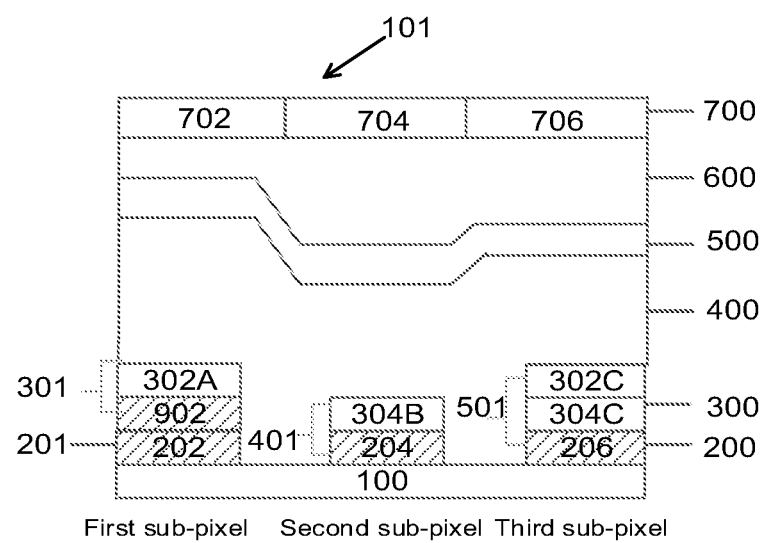
FIG. 5 is a diagram illustrating a structure of a light emitting diode according to some embodiments of the invention.

FIG. 4 shows a top-emitting organic light emitting diode 101 according to some embodiments of the present disclosure. In some embodiments, the organic light emitting diode 101 includes a pixel unit having a first sub-pixel on a substrate 100. The first sub-pixel includes a first electrode layer 301 and a dummy electrode layer 201. The first electrode layer 301 is formed on the dummy electrode layer 201. In some embodiments, the dummy electrode layer 201 includes a first reflective layer 202 formed on the substrate 100 and a first transparent conductive layer 304A formed on the first reflective layer 202. In some embodiments, the first electrode layer includes a second reflective layer 902 on the dummy electrode layer 201 and a second transparent conductive layer 302A formed on the second reflective layer 902. In some embodiments, as shown in FIG. 5, the dummy electrode layer 201 includes a first reflective layer 202 free of the first transparent conductive layer 304A. In some embodiments, the substrate may be a transparent substrate such as glass.

In some embodiments, as shown in FIG. 4 and FIG. 5, the top-emitting organic light emitting diode 101 further includes a sixth transparent conductive layer 500 formed above the second transparent conductive layer 302A. The sixth transparent conductive layer 500 and the second reflective layer 902 form a first microcavity. The first reflective layer 202 and the first transparent conductive layer 304A are not directly involved in forming the first microcavity.

In some embodiments, as shown in FIG. 4 and FIG. 5, the pixel unit further includes a second sub-pixel and a third sub-pixel. The second sub-pixel includes a second electrode layer 401, which includes a third reflective layer 204 and a third transparent conductive layer 304B formed on the third reflective layer 204. The third sub-pixel includes a third electrode layer 501, which includes a fourth reflective layer 206, a fourth transparent conductive layer 304C formed on the fourth reflective layer 206, and a fifth transparent conductive layer 302C formed on the fourth transparent conductive layer 304C.

In some embodiments, as shown in FIG. 4 and FIG. 5, the sixth transparent conductive layer 500 is also above the third transparent conductive layer 304B and the fifth transparent conductive layer 302C. The third reflective layer 204 and the sixth transparent conductive layer 500 form a second microcavity. The fourth reflective layer 206 and the sixth transparent conductive layer 500 form a third microcavity. Lengths of the first microcavity, the second microcavity, and the third microcavity are different from one another to adjust microcavity effect of the first microcavity, the second microcavity, and the third microcavity. The length of the microcavity herein refers to a vertical optical distance between the sixth transparent conductive layer and the corresponding reflective layer in the same sub-pixel. In the embodiments of the present disclosure, a dummy layer is utilized in one or some of the sub-pixels to facilitate producing different lengths of the microcavity, which may correspond to different colors of the sub-pixels. The dummy layer is not directly involved in forming the microcavity. As a result, the manufacturing process of the light emitting diode according to the embodiments of the present disclosure is simplified and requires fewer steps. Furthermore, the emitting efficiency of the light emitting diode according to the embodiments of the present disclosure is improved or maintained.

In some embodiments, a thickness d1 of the first transparent conductive layer 304A is different from a thickness d2 of the second transparent conductive layer 302A. In some embodiments, the thickness d1 of the first transparent conductive layer 304A is larger than the thickness d2 of the second transparent conductive layer 302A. In some embodiments, the first transparent conductive layer 304A and the second transparent conductive layer 302A are made of a same material. In some embodiments, the first transparent conductive layer 304A and the second transparent conductive layer 302A are made of indium tin oxide (ITO). In some embodiments, the first transparent conductive layer 304A and the second transparent conductive layer 302A are made of indium zinc oxide (IZO). In some embodiments, the first transparent conductive layer 304A and the second transparent conductive layer 302A are made of a mixture of IZO and ITO. In some embodiments, the thickness of the first transparent conductive layer is in a range of about 10-150 nm, the thickness of the second transparent conductive layer is in a range of about 10-150 nm.

In some embodiments, the thickness of the first transparent conductive layer 304A is different from the thickness of the second transparent conductive layer 302A. A thickness of the third transparent conductive layer 304B is substantially the same as the thickness of the first transparent conductive layer 304A. A thickness of the fourth transparent conductive layer 304C is substantially the same as the thickness of the first transparent conductive layer 304A. A thickness of the fifth transparent conductive layer 302C is substantially the same as the thickness of the second transparent conductive layer 302A. In some embodiments, the first transparent conductive layer 304A, the second transparent conductive layer 302A, the third transparent conductive layer 304B, the fourth transparent conductive layer 304C, and the fifth transparent conductive layer 302C are made of a same material. In some embodiments, the first transparent conductive layer 304A and the second transparent conductive layer 302A are made of IZO. In some embodiments, the first transparent conductive layer 304A and the second transparent conductive layer 302A are made of a mixture of IZO and ITO. In some embodiments, the thickness of the first transparent conductive layer is in a range of about 10-150 nm, the thickness of the second transparent conductive layer is in a range of about 10-150 nm.

In some embodiments, a thickness of the first reflective layer 202 is substantially the same as a thickness of the second reflective layer 902. In some embodiments, the thickness of the first reflective layer 202 is substantially the same as a thickness of the third reflective layer 204, and the thickness of the first reflective layer 202 is substantially the same as a thickness of the fourth reflective layer 206. The thickness of the first reflective layer 202 is substantially the same as the thickness of the second reflective layer 902. In some embodiments, the first reflective layer 202 and the second reflective layer 902 are made of a same material. In some embodiments, the first reflective layer 202, the second reflective layer 902, the third reflective layer 204, and the fourth reflective layer 206 are made of a same material. In some embodiments, the first reflective layer 202 and the second reflective layer 902 are made of metal such as Ag and Al. In some embodiments, the first reflective layer 202 and the second reflective layer 902 are made of metal alloy such as AlNd. In some embodiments, the first reflective layer 202 and the second reflective layer 902 are made of a mixture of metal and metal alloy. In some embodiments, the first reflective layer 202, the second reflective layer 902, the third reflective layer 204, and the fourth reflective layer 206 are made of metal such as Ag and Al. In some embodiments, the first reflective layer 202, the second reflective layer 902, the third reflective layer 204, and the fourth reflective layer 206 are made of metal alloy, such as AlNd. In some embodiments, the first reflective layer 202, the second reflective layer 902, the third reflective layer 204, and the fourth reflective layer 206 are made of a mixture of metal and metal alloy. In some embodiments, the first reflective layer 202 and the second reflective layer 902 are made of other metal material such as Au, Pt. etc.

In some embodiments, as shown in FIG. 4 and FIG. 5, the top-emitting organic light emitting diode 101 further includes a white Organic Light Emitting Diode emitting layer 400 on the first electrode layer 301, the second electrode layer 401, and the third electrode layer 501. The sixth transparent conductive layer 500 is on the white Organic Light Emitting Diode emitting layer 400. In some embodiments, as shown in FIG. 4 and FIG. 5, the top-emitting organic light emitting diode 101 further includes a color filter layer 700 formed on the sixth transparent conductive layer 500. The white Organic Light Emitting Diode emitting layer is an emitting layer emitting white light. The emitting layer may include a single layer or stacked layers. The emitting layer may be made of a material selected from phosphor materials and/or fluorescent materials.

In some embodiments, the top-emitting organic light emitting diode 101 further includes emitting layers in the first sub-pixel, the second sub-pixel and the third sub-pixel, respectively, to substitute the white Organic Light Emitting Diode emitting layer 400. In one embodiment, the emitting layer in the first sub-pixel may be a red emitting layer, the emitting layer in the second sub-pixel may be a green emitting layer, and the emitting layer in the third sub-pixel may be a blue emitting layer. The length of the microcavity in the first sub-pixel may be in a range of 250 to 600 nm. The length of the microcavity in the second sub-pixel may be in a range of 300 to 500 nm. The length of the microcavity in the third sub-pixel may be in a range of 200 to 500 nm. In one embodiment, the length of the microcavity in the first sub-pixel is about 405 nm. The length of the microcavity in the second sub-pixel is about 460 nm. The length of the microcavity in the third sub-pixel is about 490 nm.

In another embodiment, the emitting layer in the first sub-pixel may be a yellow emitting layer, the emitting layer in the second sub-pixel may be a green emitting layer, and the emitting layer in the third sub-pixel may be a blue emitting layer. The emitting layer may include a single layer or stacked layers. The emitting layer may be made of a material selected from phosphor materials and/or fluorescent materials. In some embodiments, the red emitting layer, the green emitting layer and the yellow emitting layer may be made of high efficient phosphor materials, and the blue emitting layer may be made of low efficient fluorescent materials.

In some embodiments, as shown in FIG. 4 and FIG. 5, the top-emitting organic light emitting diode 101 further includes a planarization layer 600 between the sixth transparent conductive layer 500 and the color filter layer 700. The color filer layer 700 is configured to convert a white light emitted from the white Organic Light Emitting Diode emitting layer 400 to light having different colors. In some embodiments, as shown in FIG. 4 and FIG. 5, the color filter layer 700 may include a first color filter 702, a second color filter 704, and a third color filter 706. In some embodiments, the first color filter 702 is a blue color filter, the second color filter 704 is a red color filter, and the third color filter 706 is a green color filter.

Colors of the sub-pixels are not limited to R, G, and B. For example, in practical application, the colors of the sub-pixels may be cyan, magenta, and yellow (C, M, and K), or may be red, green, blue, and white (R, G, B, and W), or may be cyan, magenta, yellow, and black (C, M, Y, and K). Varieties of the colors of the sub-pixels fall within the scope of protection of the present disclosure, and corresponding technical solutions also fall within the scope of protection of the present disclosure.

In some embodiments, as shown in FIG. 4 and FIG. 5, the reflective layer 200 includes the first reflective layer 202, the third reflective layer 204 and the fourth reflective layer 206. The anode layer 300 includes the second transparent conductive layer 302A, the third transparent conductive layer 304B, the fourth transparent conductive layer 304C and the fifth transparent conductive layer 302C. The sixth transparent conductive layer 500 is used as a cathode layer.

In some embodiments, the top-emitting organic light emitting diode 101 may include other layers (not shown in the drawings) such as a buffer layer between the substrate 100 and the reflective layer 200; an electron transport layer (ETL) and electron inject layer (EIL) between the sixth transparent conductive layer 500 and the white Organic Light Emitting Diode emitting layer 400; an hole transport layer (HTL) and hole inject layer (HIL) between the anode layer 300 and the white Organic Light Emitting Diode emitting layer 400.

In one embodiment, the thickness of the second transparent conductive layer 302A is about 50 nm, the thickness of the first transparent conductive layer 304A is about 100 nm. Thicknesses of the first reflective layer 202, the second reflective layer 902, the third reflective layer 204, and the fourth reflective layer 206 are substantially the same. The other layers on the substrate 100 except the planarization layer 600 have a same thickness on the three sub-pixels. In on embodiment, thickness of the white Organic Light Emitting Diode emitting layer 400 on the first sub-pixel, the second sub-pixel and the third sub-pixel is substantially the same; thickness of the sixth transparent conductive layer 500 on the first sub-pixel, the second sub-pixel and the third sub-pixel is substantially the same. The planarization layer 600 is configured to make a surface of the top-emitting organic light emitting diode to be in a uniform plane for holding the color filter layer 700. In one embodiment, the first color filter 702 is a blue color filter, the second color filter 704 is a red color filter, and the third color filter 706 is a green color filter.

Figure 7:
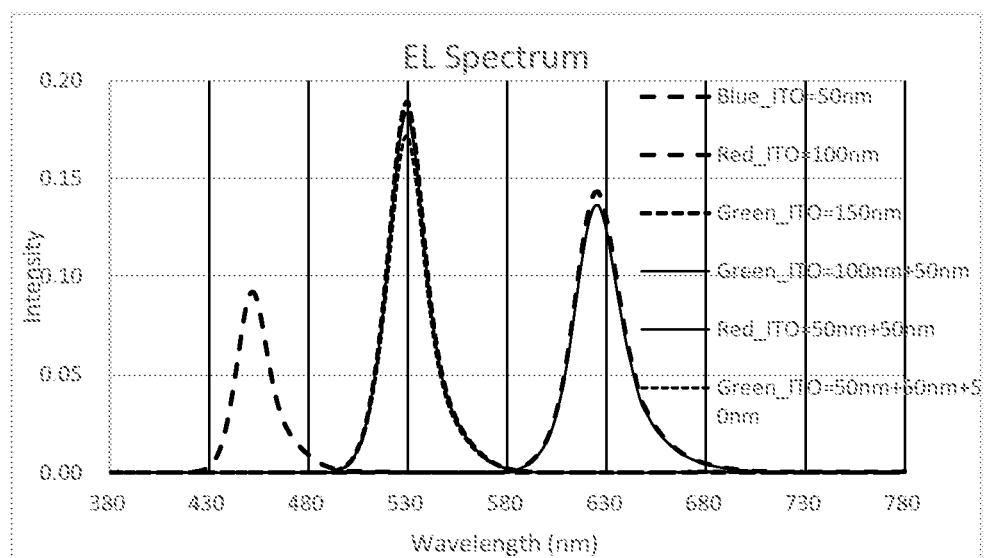
FIG. 7 is a diagram illustrating emitting efficiency of the light emitting diodes.
Figure 8:
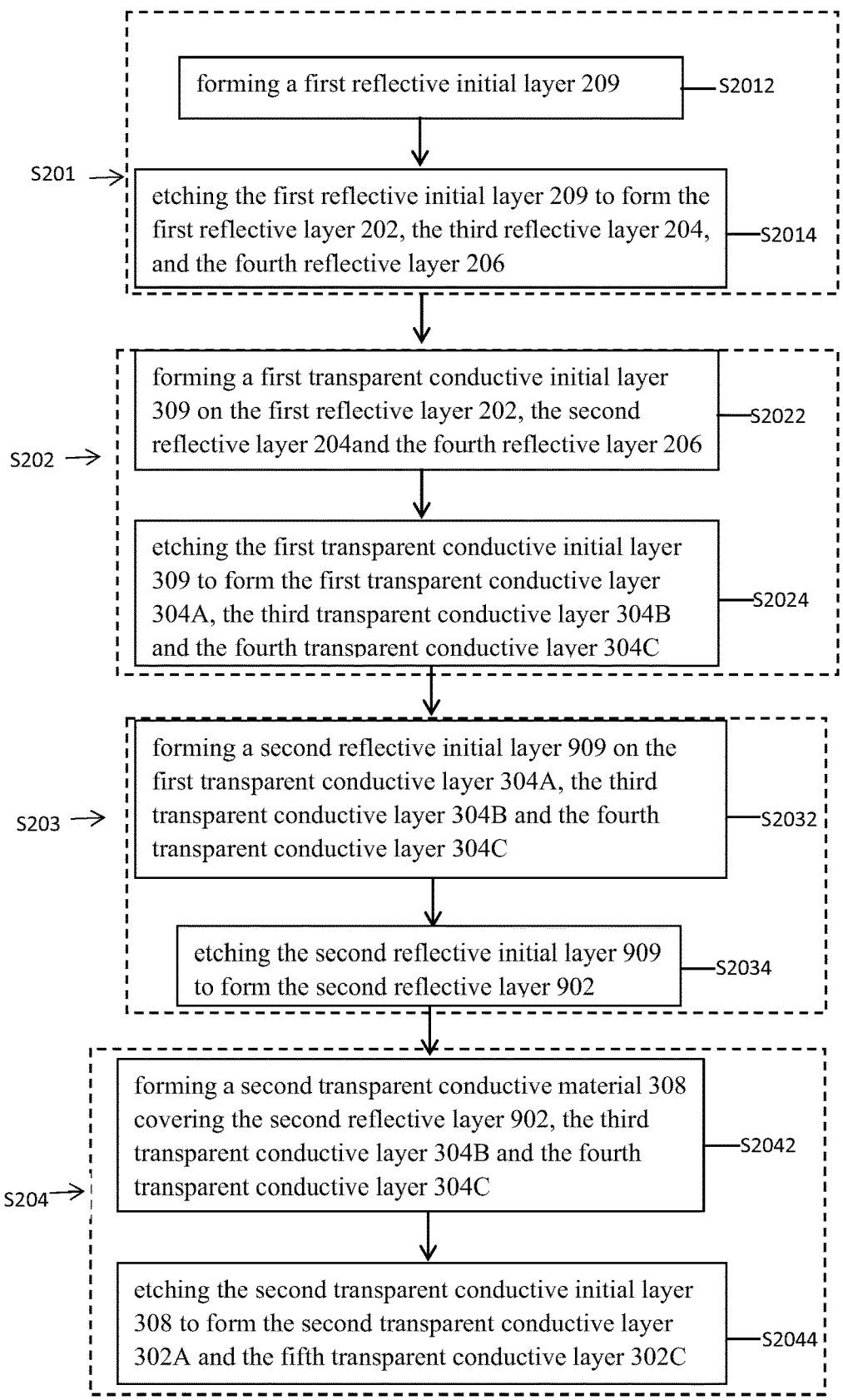
FIG. 8 is a flowchart of illustrating a method of fabricating a light emitting diode according to some embodiments of the present disclosure.

FIG. 7 compares emitting efficiency of the embodiment in FIG. 4 with that of the conventional top-emitting organic light emitting diodes in FIG. 1 and FIG. 3. As shown in FIG. 7, blue_ITO=50 nm means that the a thickness of the anode layer in the first sub-pixel is about 50 nm and made of ITO. The blue_ITO=50 nm corresponds to the first dotted line in a wavelength range of about 430 to about 500 nm. The first dotted line represents EL spectrum of the first sub-pixel in the first related-art top-emitting organic light emitting diode 101' in FIG. 1, EL spectrum of the first sub-pixel in the second related-art top-emitting organic light emitting diode 103' in FIG. 3, and EL spectrum of the first sub-pixel in the top-emitting organic light emitting diode 101 in FIG. 4. As shown in FIG. 7, the EL spectrums for the three first sub-pixels overlap with one another. That is, the emitting efficiencies of the three sub-pixels are substantially same.

Figure 9:
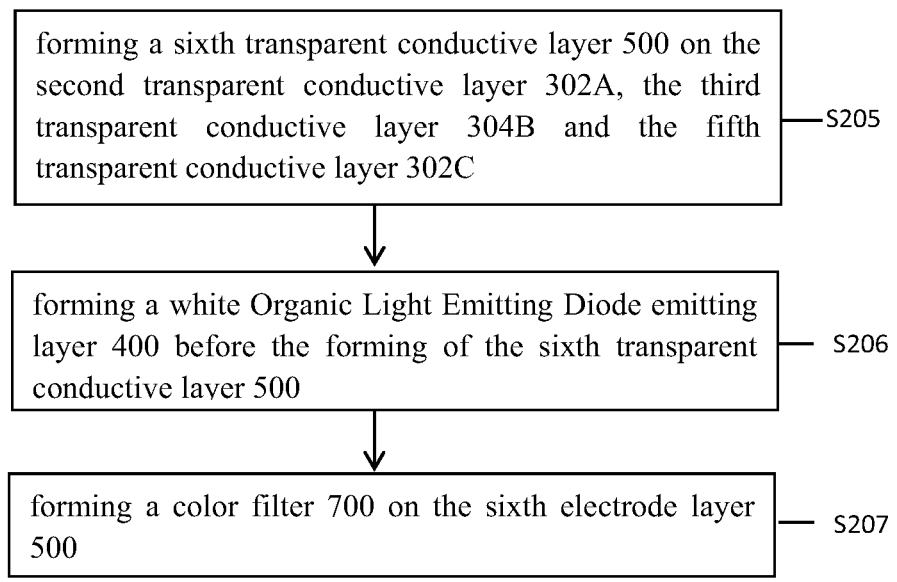
FIG. 9 is a flowchart of illustrating a method of fabricating a light emitting diode according to some embodiments of the present disclosure.

As shown in FIG. 7, red_ITO=100 nm means that a thickness of the anode layer in the second sub-pixel is about 100 nm and made of ITO. The red_ITO=100 nm corresponds to the second dotted line in a wavelength range of about 580 to about 700 nm. The second dotted line represents EL spectrum of the second sub-pixel in the first related-art top-emitting organic light emitting diode 101' in FIG. 1, and EL spectrum of the second sub-pixel in the top-emitting organic light emitting diode 101 in FIG. 4. Emitting efficiencies of these two sub-pixels are substantially same. Furthermore, red_ITO=50 nm+50 nm means that there are two sub-layers in the sub-pixel, a thickness of each of the sub-layers is 50 nm, and the anode layer is about 100 nm in total thickness and made of ITO. The red_ITO=50 nm+50 nm corresponds to the first solid line in a wavelength range of about 580 to about 700 nm. The first solid line represents EL spectrum of the second sub-pixel in the second related top-emitting organic light emitting diode 103' in FIG. 3. As shown in FIG. 9, emitting efficiency of EL spectrum of the second sub-pixel in the second related top-emitting organic light emitting diode 103' is lower than emitting efficiency of the second dotted line, which represents EL spectrum of the second sub-pixel in the top-emitting organic light emitting diode 101 in FIG. 4.

As shown in FIG. 7, green_ITO=150 nm means that a thickness of the anode layer in the third sub-pixel is about 150 nm and made of ITO. The green_ITO=150 nm corresponds to the third dotted line in a wavelength range of about 490 to about 580 nm. The third dotted line represents EL spectrum of the third sub-pixel in the first related-art top-emitting organic light emitting diode 101' in FIG. 1. Green_ITO=100 nm+50 nm means that there are two sub-layers in the sub-pixel, a thickness of one sub-layer is 100 nm, a thickness of the other is 50 nm, and the anode layer is about 150 nm in total thickness and made of ITO. The Green_ITO=100 nm+50 nm corresponds to a second solid line in a wavelength about 490 to about 580 nm. The second solid line represents EL spectrum of the third sub-pixel in the top-emitting organic light emitting diode 101 in FIG. 4. The third dotted line and the second solid line almost overlap with each other, indicating that emitting efficiencies of these two sub-pixels are substantially the same. Furthermore, green_ITO=50 nm+50 nm+50 nm means that there are three sub-layers in the sub-pixel, a thickness of each of the sub-layers is 50 nm, and the anode layer is about 150 nm in total thickness and made of ITO.

Green_ITO=50 nm+50 nm+50 nm corresponds to the fourth dotted line in a wavelength range of about 490 to about 580 nm. The fourth dotted line represents EL spectrum of the third sub-pixel in the second related-art top-emitting organic light emitting diode 103' in FIG. 3. As shown in FIG. 7, emitting efficiency of the fourth dotted line is lower than emitting efficiency of the third dotted line and the second solid line.

Compared to the first related-art top-emitting organic light emitting diode 101', the fabricating process of the organic light emitting diode according to some embodiments of the present disclosure is simplified and requires lower cost. Compared to the second related-art top-emitting organic light emitting 103', emitting efficiency of the organic light emitting diode according to some embodiments of the present disclosure is higher and less light is lost.

The top-emitting organic light emitting diode in some embodiments can adjust microcavity effects of OLED unit by adjusting thickness of the electrode layer to achieve improvement of lighting efficiency and narrow spectral width for each color of light. For example, thicknesses of the anode layers corresponding to red, green and blue emitting layers can be adjusted to control spectral width of emitting light of three colors for achieving the color balancing.

Another example of the present disclosure provides a display substrate. The display substrate includes the light emitting diode according to one of the above embodiments. The display substrate may further include a plurality of TFTs to drive the sub-pixels.

Another example of the present disclosure provides a display apparatus. The display apparatus includes the above display substrate according to one embodiment of the present disclosure. In some embodiments, the display apparatus includes the light emitting diode of one of the above embodiments. The display apparatus further includes a packing layer or a sealing layer. The display apparatus may be any product or component having a display function, such as an electronic paper display, a mobile phone, a tablet computer, a TV set, a display, a notebook computer, a digital photo frame, a navigation device, and so on.

Another example of the present disclosure provides a method of fabricating a light emitting diode. In one embodiment, the method includes the following steps S201-S204 as shown in FIGS. 6A-6H and FIG. 8.

Figure 6A:
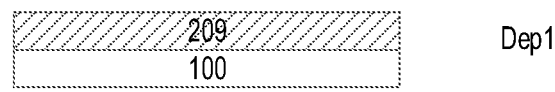
FIGS. 6A-6H are diagrams illustrating the fabrication process of the light emitting diode in FIG. 4.
Figure 6B:
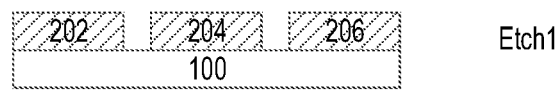

The step S201 includes forming a first reflective layer in a first sub-pixel, a third reflective layer in a second sub-pixel, and a fourth reflective layer in a third sub-pixel on a substrate. As shown in FIGS. 6A-6B, the step S201 further includes the following steps S2012 and S2014:

Step S2012 includes forming a first reflective initial layer 209 (labeled as Dep1).

Step S2014 includes etching the first reflective initial layer 209 to form the first reflective layer 202, the third reflective layer 204, and the fourth reflective layer 206 (labeled as Etch1).

Figure 6C:
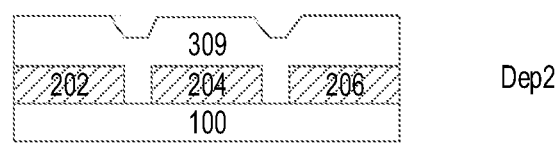
Figure 6D:
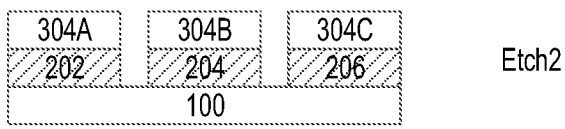

Step S202 includes forming a first transparent conductive layer 304A on the first reflective layer 202, a third transparent conductive layer 304B on the third reflective layer 204, and a fourth transparent conductive layer 304C on the fourth reflective layer 206. As shown in FIGS. 6C and 6D, step S202 further includes the following steps S2022 and S2024:

Step S2022 includes forming a first transparent conductive initial layer 309 on the first reflective layer 202, the third reflective layer 204 and the fourth reflective layer 206 (labeled as Dep2).

Step S2024 includes etching the first transparent conductive initial layer 309 to form the first transparent conductive layer 304A, the third transparent conductive layer 304B and the fourth transparent conductive layer 304C (labeled as Etch2).

Figure 6E:
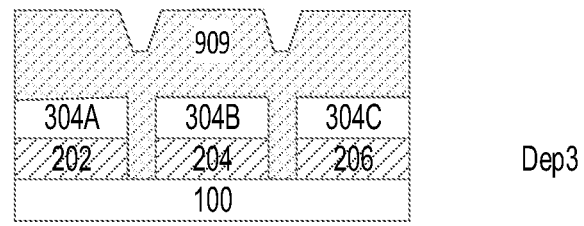
Figure 6F:
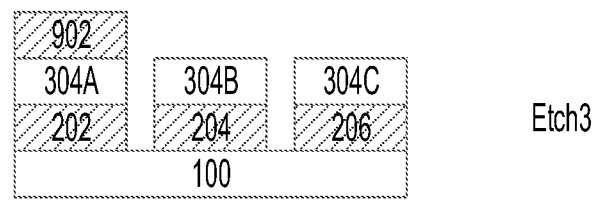

Step S203 includes forming a second reflective layer 902 only on the first transparent conductive layer 304A. As shown in FIGS. 6E-6F, the step S203 further includes the following steps S2032 and S2034:

Step S2032 includes forming a second reflective initial layer 909 on the first transparent conductive layer 304A, the third transparent conductive layer 304B and the fourth transparent conductive layer 304C (labeled as Dep3).

Step S2034 includes etching the second reflective initial layer 909 to form the second reflective layer 902 (labeled as Etch3).

Figure 6G:
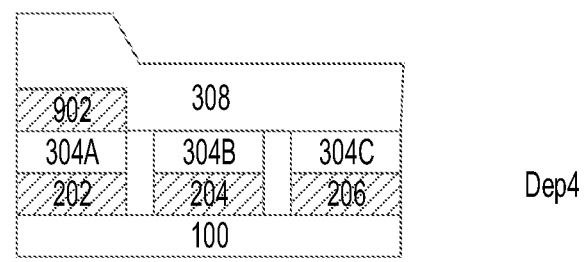
Figure 6H:
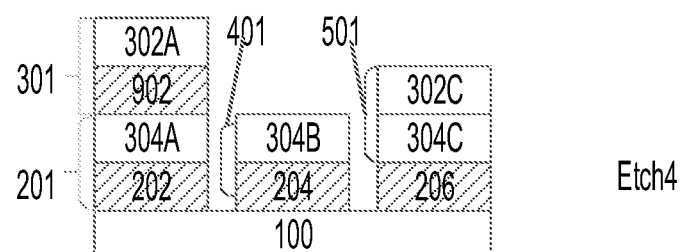

Step S204 includes forming a second transparent conductive layer 302A on the second reflective layer 902 and a fifth transparent conductive layer 302C on the fourth transparent conductive layer 304C. As shown in FIGS. 6G-6H, the step S204 further includes the following steps S2042 and S2044:

Step S2042 includes forming a second transparent conductive initial layer 308 covering the second reflective layer 902, the third transparent conductive layer 304B and the fourth transparent conductive layer 304C (labeled as Dep4).

Step S2044 includes etching the second transparent conductive initial layer 308 to form the second transparent conductive layer 302A and the fifth transparent conductive layer 302C (labeled as Etch4).

In some embodiments, the first transparent conductive layer 304A and the first reflective layer 202 constitute a dummy electrode layer. The dummy electrode layer is not directly involved in forming a microcavity.

In some embodiments, the method further includes the following steps S205-S207, as shown in FIG. 9.

Step S205 includes forming a sixth transparent conductive layer 500 on the second transparent conductive layer 302A, the third transparent conductive layer 304B and the fifth transparent conductive layer 302C.

As shown in FIG. 4, after forming the sixth transparent conductive layer, the second reflective layer 902 and the sixth transparent conductive layer 500 may form a first microcavity; the third reflective layer 204 and the sixth transparent conductive layer 500 may form a second microcavity; and the fourth reflective layer 206 and the sixth transparent conductive layer 500 may form a third microcavity. Lengths of the first microcavity, the second microcavity and the third microcavity are different from one another to adjust microcavity effect of the first microcavity, the second microcavity, and the third microcavity.

Step S206 includes forming a white Organic Light Emitting Diode emitting layer 400 before the step of forming the sixth transparent conductive layer 500.

Step S207 includes forming a color filter layer 700 on the sixth transparent conductive layer 500.

The color filter layer 700 may be configured to convert a white light emitted from the white Organic Light Emitting Diode emitting layer 400 to light having different colors. In some embodiments, the color filter layer 700 includes a first color filter 702, a second color filter 704 and a third color filter 706 as shown in FIG. 4.

The fabricating process of the light emitting diode according to the embodiment of the present disclosure only has four depositions and four etches. The process is much simplified and has lower cost than the process of the first related-art light emitting diode. Emitting efficiency of the light emitting diode produced by the fabricating process according to some embodiment of the present disclosure is higher than emitting efficiency of the second related-art light emitting diode.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should cover other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A light emitting diode, comprising:
a pixel unit comprising a first sub-pixel;
the first sub-pixel comprising a first electrode layer and a dummy electrode layer, the first electrode layer being on the dummy electrode layer;
wherein the dummy electrode layer comprises a first reflective layer, and the first electrode layer comprises a second reflective layer and a second transparent conductive layer on the second reflective layer;

the light emitting diode further comprises a sixth transparent conductive layer on the second transparent conductive layer, and the second reflective layer and the sixth transparent conductive layer form a first microcavity;

the pixel unit further comprises a second sub-pixel and a third sub-pixel, the second sub-pixel comprises a second electrode layer comprising a third reflective layer and a third transparent conductive layer on the third reflective layer, and the third sub-pixel comprises a third electrode layer comprising a fourth reflective layer, a fourth transparent conductive layer on the fourth reflective layer, and a fifth transparent conductive layer on the fourth transparent conductive layer;

the sixth transparent conductive layer is on the third transparent conductive layer and the fifth transparent conductive layer, the third reflective layer and the sixth transparent conductive layer form a second microcavity, the fourth reflective layer and the sixth transparent conductive layer form a third microcavity, and lengths of the first microcavity, the second microcavity, and the third microcavity are substantially different from one another; and the third reflective layer and the fourth reflective layer are located at a same level, and the second reflective layer is located at a level different from the third reflective layer and the fourth reflective layer.

2. The light emitting diode of claim 1, wherein the dummy electrode layer further comprises a first transparent conductive layer on the first reflective layer.

3. The light emitting diode of claim 2, wherein:

a thickness of the first transparent conductive layer is different from a thickness of the second transparent conductive layer.

4. The light emitting diode of claim 2, wherein:

a thickness of the first transparent conductive layer is different from a thickness of the second transparent conductive layer;

a thickness of the third transparent conductive layer is substantially the same as the thickness of the first transparent conductive layer;

a thickness of the fourth transparent conductive layer is substantially the same as the thickness of the first transparent conductive layer; and a thickness of the fifth transparent conductive layer is substantially the same as the thickness of the second transparent conductive layer.

5. The light emitting diode of claim 4, wherein:

the thickness of the first transparent conductive layer is larger than the thickness of the second transparent conductive layer.

6. The light emitting diode of claim 2, wherein:

material of the first transparent conductive layer is the same as material of the second transparent conductive layer.

7. The light emitting diode of claim 6, wherein:

the material of the first transparent conductive layer comprises ITO or IZO.

8. The light emitting diode of claim 1, further comprising:

a white Organic Light Emitting Diode emitting layer on the first electrode layer, the second electrode layer, and the third electrode layer; and a color filter layer on the sixth transparent conductive layer; wherein:

the sixth transparent conductive layer is on the white layer the white Organic Light Emitting Diode emitting layer; and the color filter layer is configured to convert a white light emitted from the white Organic Light Emitting Diode emitting layer to light having different colors.

9. The light emitting diode of claim 1, wherein:

a thickness of the first reflective layer is substantially the same as a thickness of the second reflective layer.

10. The light emitting diode of claim 1, wherein:

material of the first reflective layer is the same as material of the second reflective layer.

11. A display substrate comprising the light emitting diode of claim 1.

12. A display apparatus comprising the display substrate of claim 11.

* * * * *